United States Patent [19]

Chihara et al.

[11] Patent Number: 5,821,529

[45] Date of Patent: Oct. 13, 1998

[54] MEASURING BOARD HAVING AN OPTICALLY DRIVEN SWITCH AND I/O TERMINAL TESTING SYSTEM USING THE SAME

[75] Inventors: Kazunori Chihara; Koji Sasaki; Takashi Sekino, all of Tokyo, Japan

[73] Assignee: Advantest Corporation, Tokyo, Japan

[21] Appl. No.: 838,429

[22] Filed: Apr. 7, 1997

[51] Int. Cl.[6] .................................................. H01J 40/14
[52] U.S. Cl. .................................. 250/214.1; 250/214 R; 324/753
[58] Field of Search ........................... 250/214.1, 214 R, 250/551; 324/753, 750; 356/237, 430

[56] References Cited

U.S. PATENT DOCUMENTS 4,827,437   5/1989   Blanton ............................. 364/571.01

*Primary Examiner*—Que Le
*Attorney, Agent, or Firm*—Knobbe, Martens, Olson & Bear, LLP.

[57] ABSTRACT

There is provided a measuring board, in which an I/O switch is formed in the vicinity of an I/O terminal on the board and no deformation occurs in the wave form of an input signal. In the vicinity of the I/O terminal on the measuring board, on which a device to be measured (DUT) is mounted and in which testing is performed for the I/O terminal, there are provided a plurality of optically driven switches, each of which is composed of a photoconductive switch having electrodes with an electrode gap of a specified width on a semi-insulating semiconductor substrate and a semiconductor laser provided so as to irradiate the electrode gap. By these optically driven switches, input and output switching is performed for the I/O terminal.

10 Claims, 4 Drawing Sheets

MEASURING BOARD HAVING AN OPTICALLY DRIVEN SWITCH AND I/O TERMINAL TESTING SYSTEM USING THE SAME

BACKGROUND OF THE INVENTION

1. Field of the Invention

The present invention relates to a measuring board, on which a measured device (DUT: Device Under Test) of a memory integrated circuit and so on is mounted, and an I/O terminal testing system using the measuring board.

2. Description of the Related Art

In I/O terminal testing of a measured device (hereinafter, referred to as DUT ), the DUT is mounted on a measuring board, and the operation of the DUT when a prescribed operational condition is given is verified while switching the input and output of the I/O terminal of the mounted DUT by an I/O switch. The I/O terminal test for an integrated circuit such as a memory has come to be performed at high speed by making use of high speed input signals in order to perform an at-speed-test of the more high-speed IC within a reduced test-time. Thus, in the case of a system which uses an I/O terminal changeover switch like that described above, there have arisen problems as follows.

In the system using the I/O switch, because of limitation to the sheer size of the I/O switch, the I/O switch cannot be placed close to the DUT on the measuring board. Accordingly, when I/O terminal testing is to be performed at a high speed, colliding occurs between an input signal and an output signal because of a delay (Round trip Delay) between the I/O switch and the DUT.

In order to solve the foregoing problem, there has been presented an I/O terminal testing system, which is capable of performing testing by using a pin electronics circuit composed of a driver, a comparator and so on so as to separate the driver (input side) and the comparator (output side) from each other. One example of this system is shown in FIG. 1.

Referring to FIG. 1, a DUT 100 is mounted on the measuring board, and a driver 102 and a comparator 103 are connected to its I/O terminal via transmission lines (ex. coaxial cables) 101a and 101b. An input signal line from the driver 102 is terminated by terminal resistance Z0 in the driver 102, and an output signal line to the comparator 103 is terminated by terminal resistance Z0 in the comparator 103.

In this I/O terminal testing system, an input signal from the driver 102 is input to the DUT 100, a prescribed operation is performed in the DUT 100 based on the input signal and its result is sent out as an output signal to the comparator 103. In the comparator 103, comparison is made between the input signal and an expected value, and the operation of the I/O terminal of the DUT 100 is performed based on its comparing result. However, in this I/O terminal testing system, since the driver side and the comparator side are respectively terminated by the terminal resistance, measuring is limited to a DUT which has a large output current. Accordingly, measuring cannot be performed for, for instance a CMOS device and so on which have small output currents.

As a system capable of performing testing of the I/O terminal of the CMOS device, there is available a system like that shown in FIG. 2, which has a FET switch 104 and a buffer amplifier 105 provided close to the I/O terminal of the DUT mounted on the measuring board in the foregoing system constitution. Referring to FIG. 2, the FET switch 104 is provided in a connection line between the transmission line 101a and the I/O terminal, and a driver 102' for performing switch control is connected to its gate via a transmission line 101a'. The buffer amplifier 105 is provided in a connection line between the transmission line 101b and the I/O terminal, and this buffers an output signal from the DUT 100.

In this I/O terminal testing system, an input signal is inputted from the driver 102 to the DUT 100 with the FET switch 104 switched ON. When an output signal is outputted from the DUT 100 based on its input signal, the FET switch 104 is switched OFF, and the output signal is amplified by the buffer amplifier 105 and then inputted to the comparator 103.

Thus, the problems inherent in the foregoing conventional I/O terminal testing systems are summarized as follows.

In the case of the system, in which the I/O switch cannot be arranged close to the DUT on the measuring board, colliding occurs between an input signal and an output signal because of a delay (Round trip Delay) between the I/O switch and the DUT, and this makes it impossible to obtain an accurate testing result.

In the case of the system shown in FIG. 1, only a DUT which has a large output current can be measured, and this makes it impossible to measure a CMOS device and so on which have small output currents.

Furthermore, in the case of the system shown in FIG. 2, although a CMOS device and so on which have small output currents can be measured, if there are a number of I/O terminals, it is difficult to provide a FET switch and a buffer amplifier close to each I/O terminal. In addition, there is a problem of deformation, which occurs in the wave form of an input signal because of the parasitic capacitance of the FET switch. Also, if the FET of a low parasitic capacitance is utilized at a high speed, current leakage occurs between a gate and a drain and between the gate and a source. This current leakage results in a reduction in the accuracy of DC current measurement (DC current flowing through the I/O terminal is measured), which is included in I/O terminal testing.

SUMMARY OF THE INVENTION

The present invention was made to solve the foregoing problems, and it is an object of the invention to provide a measuring board, which enables an I/O switch to be formed close to an I/O terminal on the board and highly accurate measurement to be performed without producing any deformation of an input signal wave form. It is another object of the invention to provide an I/O terminal testing system using this measuring board.

To achieve the above described object, according to the present invention, a device to be tested is mounted on a measuring board for testing an I/O terminal of the device, wherein an optically driven switch composed of a photo-conductive switch constructed by forming electrodes with a gap of a set width on a semi-conductor substrate and luminophor are provided close to said I/O terminal on said board, and input and output switching performed for said optically driven switch.

In this case, the luminophor element may be a semiconductor laser.

The semi-insulating semiconductor substrate may be a III-V group compound semiconductor substrate or a photo-conductive semiconductor substrate.

Also, the optically driven switch may be provided in each of the input and output signal lines of the I/O terminal on the board.

Furthermore, a plurality of such optically driven switches may be provided in an array form housed in a package, and switching performed between an input and an output via the package in the vicinity of the I/O terminal on the board.

The I/O terminal testing system of the present invention has any one of the measuring boards in the foregoing constitutions and a tester for performing specified I/O terminal testing for the device to be measured by controlling input and output switching of the I/O terminal by the optically driven switch on the measuring board.

According to the foregoing constitution of the measuring board of the present invention, since the size of the optically driven switch is several millimeters or less (described in detail later with reference to the embodiment), it is possible to form it in the vicinity of the I/O terminal on the board. Such formation of the optically driven switch in the vicinity of the I/O terminal on the board enables a delay (Round trip Delay), which has conventionally been a problem, to be reduced. Consequently, colliding will not occur between an input signal and an output signal can be measured in well as occur in the conventional case.

Also, since switching of the optically driven switch is performed by an output light from the semiconductor laser, current leakage which has occurred in the FET switch is prevented. Consequently, no reduction will occur in the accuracy of a DC current measurement unlike that in the conventional case.

Furthermore, the electrode space of the photoconductive switch which constitutes the optically driven switch can be set to several micrometers. Because of such a very small electrode space, even when the parasitic capacitance of the optically driven switch becomes small and the speed of the input and output signals is increased, their wave forms will not be deformed.

The present invention having the foregoing constitution is effective when accurate testing results are to be obtained, because of no collision between the input and output signals. Moreover, the invention is effective when speeds for the input and output signals are to be increased higher than conventionally possible and an I/O terminal testing period is to be shortened, because of a small delay (round trip Delay).

In addition,. since no current leakage occurs, as it does in the FET switch, the accuracy of DC current measuring can be improved. Also, because of no mechanical driving part provided in the switch, no testing interruption due to a switch failure occurs.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENT

The preferred embodiment of the present invention will now be described with reference to the accompanying drawings.

Figure 1:
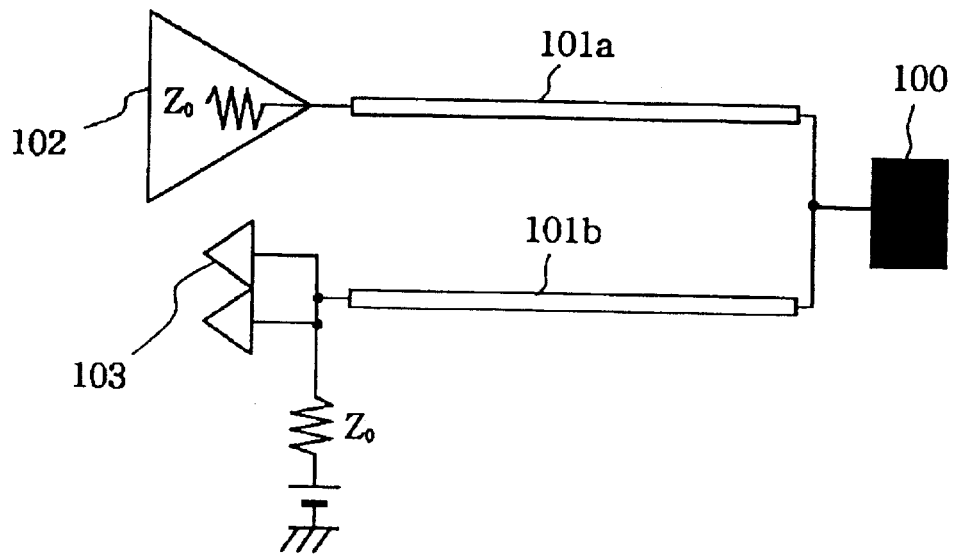
FIG. 1 is a view showing a constitution of I/O terminal input and output parts of a conventional I/O terminal testing system.
Figure 2:
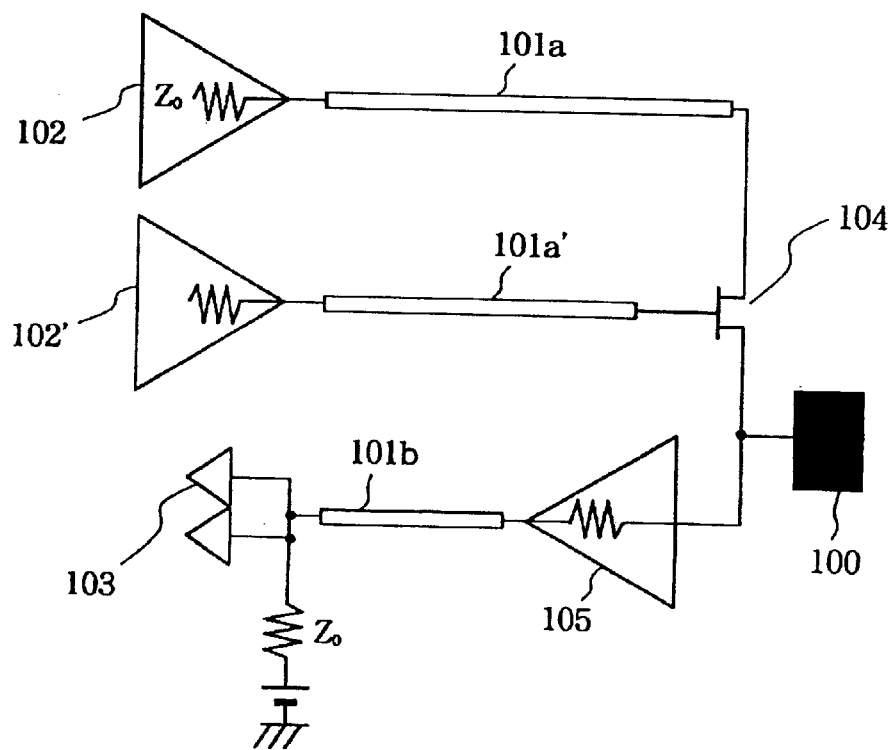
FIG. 2 is a view showing a constitution of I/O terminal input and output parts of an I/O terminal testing system capable of performing testing and measuring for a CMOS device.
Figure 3:
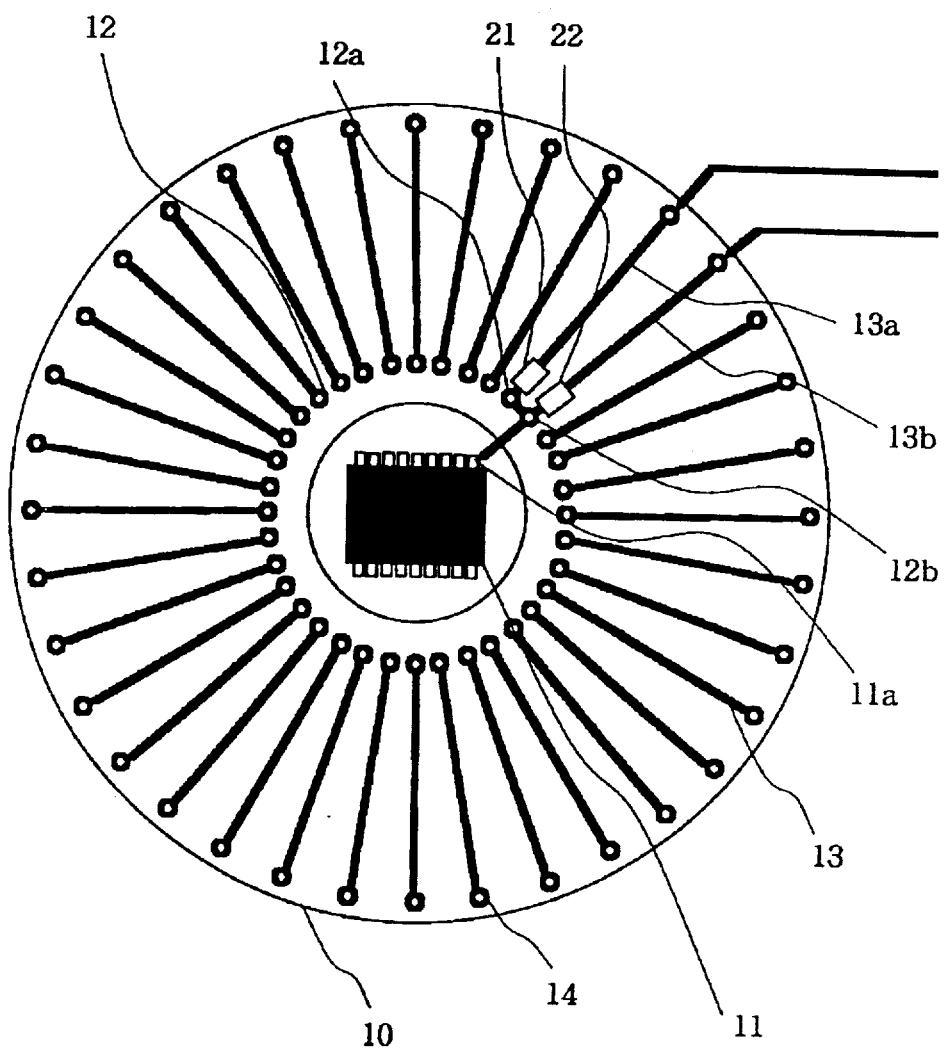
FIG. 3 is a constitutional view of a measuring board of an embodiment of the present invention.

FIG. 3 is a constitutional view of a measuring board of an embodiment of the present invention. In the drawing, a measuring board 10 is formed in a disk shape, and a DUT 11 is mounted on its center. In the vicinity of the DUT 11 mounting part, there are formed a plurality of terminals 12 at specified intervals in a peripheral direction. A wiring 13 is radially formed from each terminal in an outer peripheral direction. A terminal 14 is formed in the end of each wiring. The I/O terminal 11a of the DUT 11 is connected to two terminals (terminals 12a and 12b), which are arranged in the vicinity thereof. One of these terminals is used for outputting (terminal 12a) and the other is used for inputting (terminal 12b). An optically driven switch 21 is formed in a wiring (13a), which is connected to the input terminal 12a, and an optically driven switch 22 is formed in a wiring (13b), which is connected to the output terminal 12b.

Figure 4:
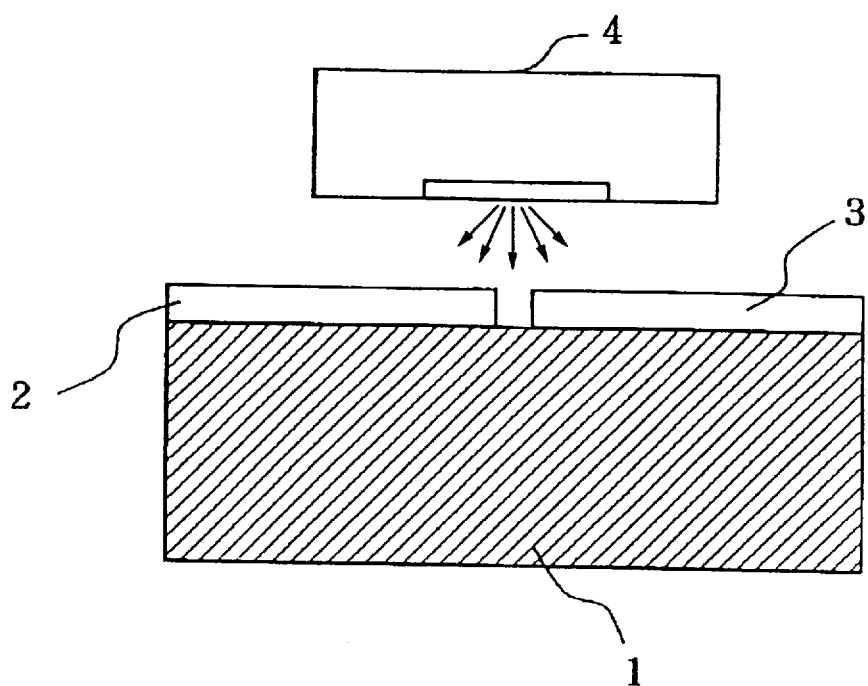
FIG. 4 is a constitution view of an optically driven switch incorporated in the measuring board shown in FIG. 3.

Each of the foregoing optically driven switches 21 and 22 has a constitution like that shown in FIG. 4. More particularly, it is composed of a photoconductive switch, which has electrodes 2 and 3 with a specified electrode gap on a semi-insulating semiconductor substrate 1 formed of a III-V group, for instance indium phosphorus, compound semiconductor substrate or a gallium arsenic or silicon photoconductive semiconductor substrate, and a semiconductor laser diode 4 provided so as to irradiate the electrode gap. The semiconductor laser diode 4 has a size set to several millimeters, and is fixed on the photoconductive switch substrate by solder bonding, and so on. The electrodes 2 and 3 are formed by a known lift-off process, that is, by a process during which metallic film is formed by vapor-depositing a metal, which becomes an electrode after this is coated with a resist, exposed to a UV light based on a mask having a specified pattern and developed and the resist in the exposed part is eliminated, and the metal in the non-exposed part is eliminated (lifted off) together with the resist. This forming method enables an electrode space having a micrometer order to be realized. For such an optically driven switch, a switch whose entire size is some millimeters can be realized. Herein, the semiconductor laser diode 4 is used. However, any kind may be used as long as this is capable of electrically controlling light emission. For instance, various semiconductor lasers can be used.

In the optically driven switches 21 and 22 thus constructed, after a specified voltage is applied between the electrodes 2 and 3 and a light from the semiconductor laser diode 4 is projected, electric conductivity is increased by a carrier, which has been produced in the semi-insulating semiconductor substrate 1, and thereby a resistance value the electrodes 2 and 3 is reduced. If no light is projected, insulation is formed between the electrodes 2 and 3. Thus, switching according to an incident light for irradiation can be performed.

In the measuring board of the embodiment, input and output switching of the I/O terminal is performed by controlling the optically driven switches 21 and 22 and testing of the I/O terminal of the mounted DUT is executed.

Figure 5:
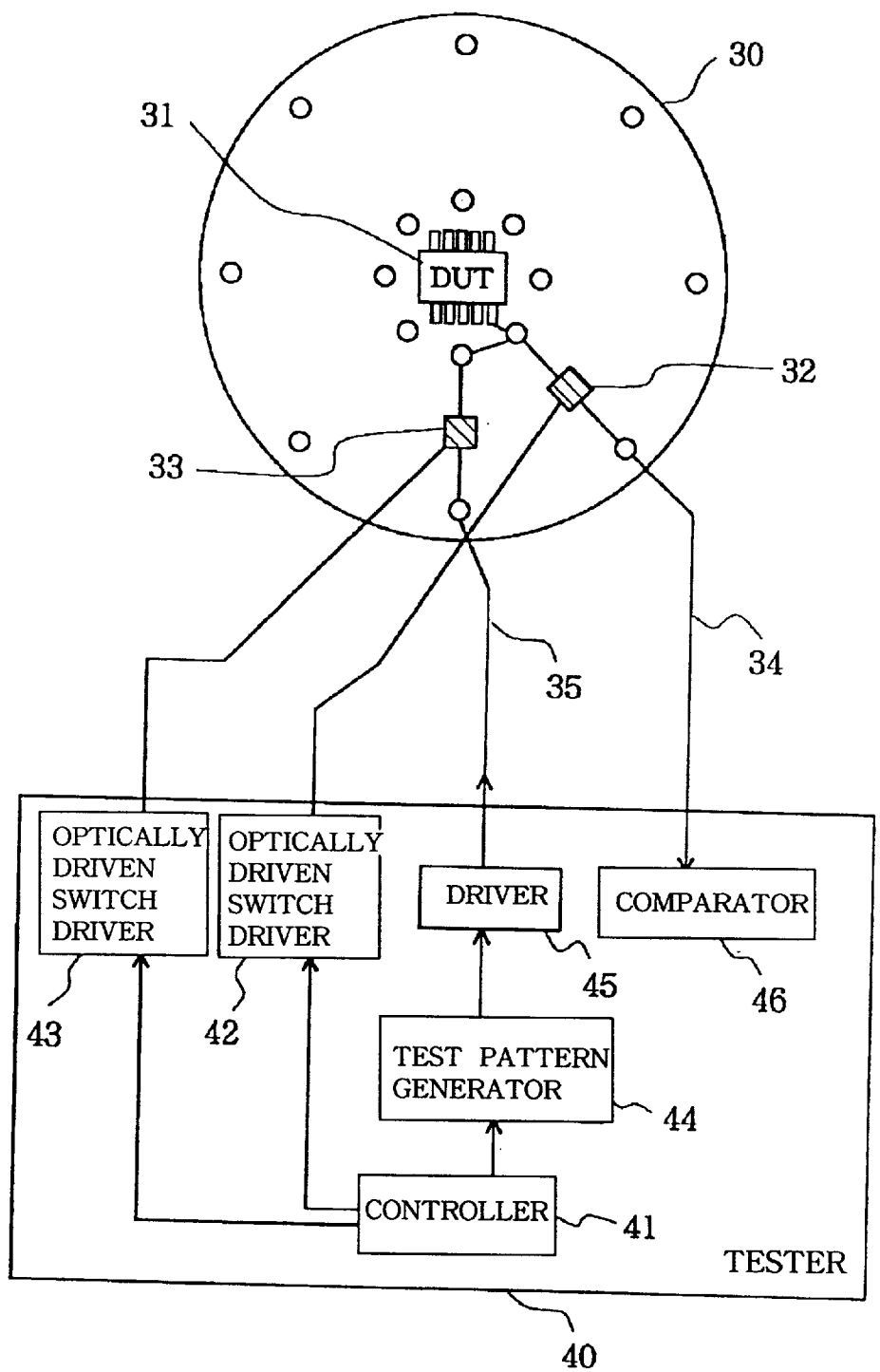
FIG. 5 is a block diagram showing one example of an I/O terminal testing system which uses the measuring board shown in FIG. 3.

FIG. 5 shows one example of an I/O terminal testing system using the measuring board shown in FIG. 3.

Referring to FIG. 5, the I/O terminal testing system is composed of a measuring board 30 and a tester 40. The measuring board 30 has the same constitution as that of the measuring board shown in FIG. 3, and a DUT 31 is mounted on its center. To the I/O terminal of this DUT 31, there are respectively connected an output signal line 34 via an optically driven switch 32 and an input signal line 35 via an optically driven switch 33.

The tester 40 is composed of a controller 41, optically driven switch drivers 42 and 43 for respectively driving the optically driven switches 32 and 33, a test pattern generator 44 for generating a test pattern for a writing/reading signal, and so on, a driver 45 for sending out an input signal based on the test pattern to the input signal line 35 and a comparator 46, to which an output signal from the DUT 31 based on the test pattern is input via the output signal line 34.

Next, the operation of the foregoing I/O terminal testing system will be described. Herein, explanation will be made of the case that operational testing is performed for, for instance a built-in memory integrated circuit, as testing of the I/O terminal of the DUT 31.

When a specified test pattern for a writing/reading signal is generated in the test pattern generator 44 inside the tester 40, an input signal based on the test pattern is inputted from the driver 45 to the DUT 31. At this time, the controller 41 controls the optically driven switch drivers 42 and 43 so as to switch ON (laser diode is driven) the optically driven switch 33 and switch Off the optically driven switch 32.

After the input signal based on the test pattern has been inputted from the driver 45 through the input signal line 35 to the DUT 31, in the DUT 31 a prescribed operation is performed based on the input signal, and its result is sent out as an output signal to the output signal line 34. At this time, the controller 41 controls the optically driven switch drivers 42 and 43 so as to switch Off the optically driven switch 33 and switch ON the optically driven switch 32 (laser diode is driven). In this manner, the output signal sent out from the DUT 31 is input through the output signal line 34 to the comparator 46 in the tester 40.

In the comparator 46, comparison is made between the input signal and an expected value, and based on its comparison result, verification is performed for the operation of the I/O terminal of the DUT 31.

The foregoing constitutions of the I/O terminal testing system and the measuring board are not limited to optically driven switch 32 (laser diode is driven). In this manner, the output signal sent out from the DUT 31 is input through the output signal line 34 to the comparator 46 in the tester 40.

In the comparator 46, comparison is made between the input signal and an expected value, and based on its comparison result, verification is performed for the operation of the I/O terminal of the DUT 31.

The foregoing constitutions of the I/O terminal testing is not necessarily limited to those shown in the drawings, and thus proper constitutions may be selected according to the kind of a DUT and measuring conditions. For example, in FIG. 5, the optically driven switch is provided in each line for impedance alignment between the input signal line and the output signal line. However, in the case of testing for a DUT which can use the terminal resistance, the optically driven switch may be provided only in the input signal line side, and the output signal line may be terminated by the terminal resistance. Also, the measuring board shown in FIG. 5 is formed in a disk shape, but another shape may be selected.

Furthermore, in this embodiment, as shown in FIG. 5, the constitution is employed, in which the optically driven switches 32 and 33 are individually provided in the output signal line 34 and the input signal line 35. But another constitution may be employed, in which a plurality of optically driven switches are arrange in an array form and housed in a package. In such a case, a measuring board for mounting a DUT needs to be formed of a rectangular substrate, and input and output switching needs to be performed via the package in the vicinity of the I/O terminal. Herein, each optically driven switch in the package is independently driven, and only the optically driven switch connected to the I/O terminal can be driven. In addition, this package may be provided so as to be independent of the measuring board or mounted on the measuring board. Since the optically driven switches are provided in the array form and housed in the package as described above, it is possible to provide a compact and low cost measuring board.

Although the preferred embodiment of the present invention has been described in detail, it should be understood that various changes, substitutions and alternations can be made therein without departing from spirit and scope of the inventions as defined by the appended claims.

What is claimed is:

1. A measuring board on which a device to be measured is mounted for testing an I/O terminal of said device; comprising an optically driven switch composed of a photoconductive switch constructed by forming electrodes with a gap of a set width on a semi-insulating semi-conductor substrate and a luminophor, wherein said optically driven switch and luminophor are set adjacent to said I/O terminal on said board so as to perform input and output testing for said device.

2. The measuring board according to claim 1, wherein said luminophor is a semiconductor laser.

3. The measuring board according to claim 1, wherein said semi-insulating semiconductor substrate is at least one of a III-V group compound semiconductor substrate and a photoconductive semiconductor substrate.

4. The measuring board according to claim 1, wherein said optically driven switch is provided in each of an input signal line and an output signal line of said I/O terminal on said board.

5. The measuring board according to claim 1, wherein a plurality of said optically driven switches are arranged in an array form housed in a package and input and output switching for said I/O terminal is performed in the vicinity of said I/O terminal on the board via said package.

6. An I/O terminal testing system comprising:
   a measuring board on which a device to be measured is mounted for testing an I/O terminal of said device;
   an optically driven switch which is composed of a photoconductive switch and a luminophor and is provided adjacent to said I/O terminal of said device on said board, said photoconductive switch having electrodes with a gap of a set width on a semi-insulating semi-conductor substrate and said luminophor illuminating said gap of said electrodes to perform input and output switching for said I/O terminal; and
   a tester to control timings of said input and output switching for said I/O terminal by said optically driven switch to carry out specified I/O terminal testing for said device.

7. The I/O terminal testing system according to claim 6 wherein said luminophor is a semiconductor laser.

8. The I/O terminal testing system according to claim 6, wherein said semi-insulating semiconductor substrate is at least one of a III-V group compound semiconductor substrate and a photoconductive semiconductor substrate.

9. The I/O terminal testing system according to claim 6, wherein said optically driven switch is provided in each of an input signal line and output signal line of said I/O terminal on said board.

10. The I/O terminal testing system according to claim 6, wherein a plurality of said optically driven switches are arranged in an array form housed in a package and said input and output switching for said I/O terminal is performed in the vicinity of said I/O terminal on the board via said package.

* * * * *

UNITED STATES PATENT AND TRADEMARK OFFICE
CERTIFICATE OF CORRECTION

PATENT NO. : 5,821,529
DATED : October 13, 1998
INVENTOR(S) : Kazunori Chihara; Koji Sasaki; Takashi Sekino It is certified that error appears in the above-identified patent and that said Letters Patent is hereby corrected as shown below:

Title page, item [30] insert the following text:

"[30] "Foreign Application Priority Data"
April 10, 1996   [JP]   Japan..................................................8/088212"

Signed and Sealed this

Twenty-seventh Day of April, 1999

Attest:

Q. TODD DICKINSON

*Attesting Officer*    *Acting Commissioner of Patents and Trademarks*